(12) United States Patent
Ilango et al.

(10) Patent No.: US 9,634,621 B1
(45) Date of Patent: Apr. 25, 2017

(54) CHARGE-PUMP POWER SUPPLY WITH VOLTAGE-HEADROOM-DEPENDENT SUPPLY VOLTAGE

(71) Applicant: Cirrus Logic, Inc., Austin, TX (US)

(72) Inventors: Anand Ilango, Austin, TX (US);
Aniruddha Satoskar, Austin, TX (US);
Daniel John Allen, Austin, TX (US);
Bharath Kumar Thandri, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 599 days.

(21) Appl. No.: 14/035,654

(22) Filed: Sep. 24, 2013

(51) Int. Cl.
*H03F 3/20* (2006.01)
(52) U.S. Cl.
CPC ....................... *H03F 3/20* (2013.01)
(58) Field of Classification Search
CPC ............ H03F 1/025; H03F 2200/507; H03F 2200/03; H03F 1/0211
USPC ......... 381/120, 121, 123, 150, 323; 323/304
See application file for complete search history.

(56) References Cited

U.S. PATENT DOCUMENTS

| | | | |
|---|---|---|---|
| 7,830,209 B1 | 11/2010 | Woodford et al. | |
| 8,008,975 B1 | 8/2011 | Allen et al. | |
| 8,311,243 B2 * | 11/2012 | Tucker | H02M 3/07 381/120 |
| 8,363,856 B2 * | 1/2013 | Lesso | H02M 3/07 381/120 |
| 2011/0148385 A1 * | 6/2011 | North | G05F 3/16 323/304 |

* cited by examiner

*Primary Examiner* — Md S Elahee
(74) *Attorney, Agent, or Firm* — Jackson Walker L.L.P.

(57) ABSTRACT

A method may include providing a power supply voltage to a power supply input of a power amplifier by a charge pump power supply having a select input for selecting an operating mode of the charge pump power supply, such that in a first operating mode, the power supply voltage is equal to a first voltage, and such that in a second operating mode the power supply voltage is equal to a fraction of the first voltage; wherein the power amplifier has an audio input for receiving an audio input signal, and an audio output for providing the output signal, and generates the output signal based on the audio input signal. The method may also include selecting an operating mode of the charge pump power supply based on a magnitude of the power supply voltage and a magnitude of the output signal, such that the charge pump power supply operated in the operating mode having the lowest power supply voltage in which a difference between a magnitude of the power supply voltage and a magnitude of the output signal is more than the predetermined threshold voltage.

24 Claims, 4 Drawing Sheets

CHARGE-PUMP POWER SUPPLY WITH VOLTAGE-HEADROOM-DEPENDENT SUPPLY VOLTAGE

FIELD OF DISCLOSURE

The present disclosure relates in general to circuits for personal audio devices such as wireless telephones and media players, and more specifically, to systems and methods for conserving energy in a personal audio device output stage by employing a charge pump power supply that generates an operating mode-dependent output stage power supply voltage, wherein the selected operating modes are based on a headroom of an output signal relative to the power supply voltage.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers, and the power amplifier may often be the primary consumer of power in a personal audio device, and thus, may have the greatest effect on the battery life of the personal audio device. In devices having a linear power amplifier for the output stage, power is wasted during low signal level outputs, because the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s).

In order to provide a changeable power supply voltage to such a power amplifier, a charge pump power supply may be used, such as that disclosed in U.S. patent application Ser. No. 11/610,496 (the "'496 application"), in which an indication of the signal level at the output of the circuit is used to control the power supply voltage. The above-described topology may raise the efficiency of the audio amplifier, in general, as long as periods of low signal level are present in the audio source. Typically in such topologies, a plurality of thresholds define output signal level-dependent operating modes for the charge pump power supply, wherein a different supply voltage is generated by the charge pump power supply in each mode. In traditional approaches, the various thresholds are set for a worst-case scenario of the power amplifier (e.g., load impedance, process, temperature, etc.), such that in each mode, the power supply voltage is enough to provide a sufficient voltage headroom in order to prevent clipping of the output signal generated by the power amplifier. However, because a worst-case scenario is assumed in such approaches, when the worst-case scenario is not present, the power supply voltage provided by the charge pump power supply in some modes may be well in excess of that needed to provide sufficient voltage headroom, thus causing power inefficiency.

Therefore, it would be desirable to provide a charge-pump power supply that supplies power to an audio power amplifier circuit for a consumer audio device, in which the efficiency of the charge pump is improved.

SUMMARY

In accordance with the teachings of the present disclosure, the disadvantages and problems associated with existing approaches to driving audio output signals may be reduced or eliminated.

In accordance with embodiments of the present disclosure, and audio amplifier circuit for providing an output signal to an audio transducer may include a power amplifier, a charge pump power supply, and a control circuit. The power amplifier may have an audio input for receiving an audio input signal, an audio output for providing the output signal, and a power supply input, wherein the power amplifier may generate the output signal based on the audio input signal. The charge pump power supply may be configured to provide a power supply voltage to the power supply input, wherein the charge pump power supply has a select input for selecting an operating mode of the charge pump power supply, such that in a first operating mode, the power supply voltage is equal to a first voltage, and such that in a second operating mode the power supply voltage is equal to a fraction of the first voltage. The control circuit may generate the select input based on a magnitude of the power supply voltage and a magnitude of the output signal, such that the charge pump power supply operates in the operating mode having the lowest power supply voltage in which a difference between a magnitude of the power supply voltage and a magnitude of the output signal is more than the predetermined threshold voltage.

In accordance with these and other embodiments of the present disclosure, a method for providing an output signal to an audio transducer may include providing a power supply voltage to a power supply input of a power amplifier by a charge pump power supply having a select input for selecting an operating mode of the charge pump power supply, such that in a first operating mode, the power supply voltage is equal to a first voltage, and such that in a second operating mode the power supply voltage is equal to a fraction of the first voltage; wherein the power amplifier has an audio input for receiving an audio input signal, and an audio output for providing the output signal, and generates the output signal based on the audio input signal. The method may also selecting an operating mode of the charge pump power supply based on a magnitude of the power supply voltage and a magnitude of the output signal, such that the charge pump power supply operated in the operating mode having the lowest power supply voltage in which a difference between a magnitude of the power supply voltage and a magnitude of the output signal is more than the predetermined threshold voltage.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
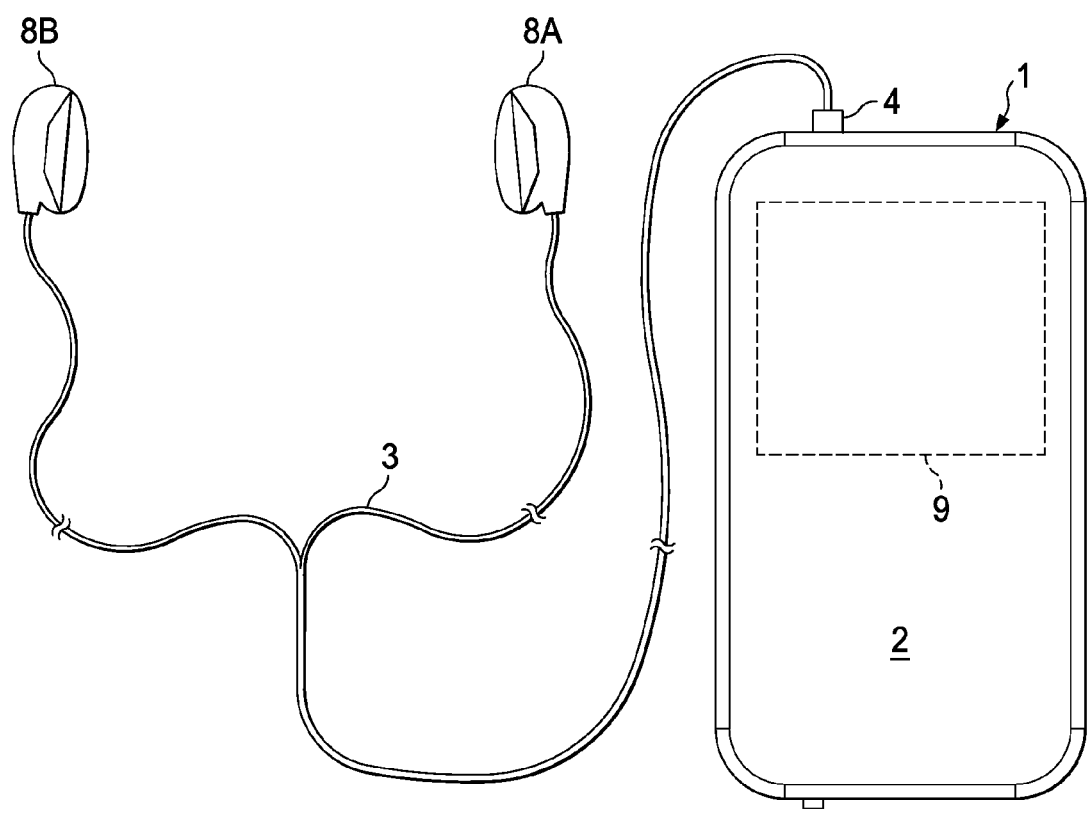
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
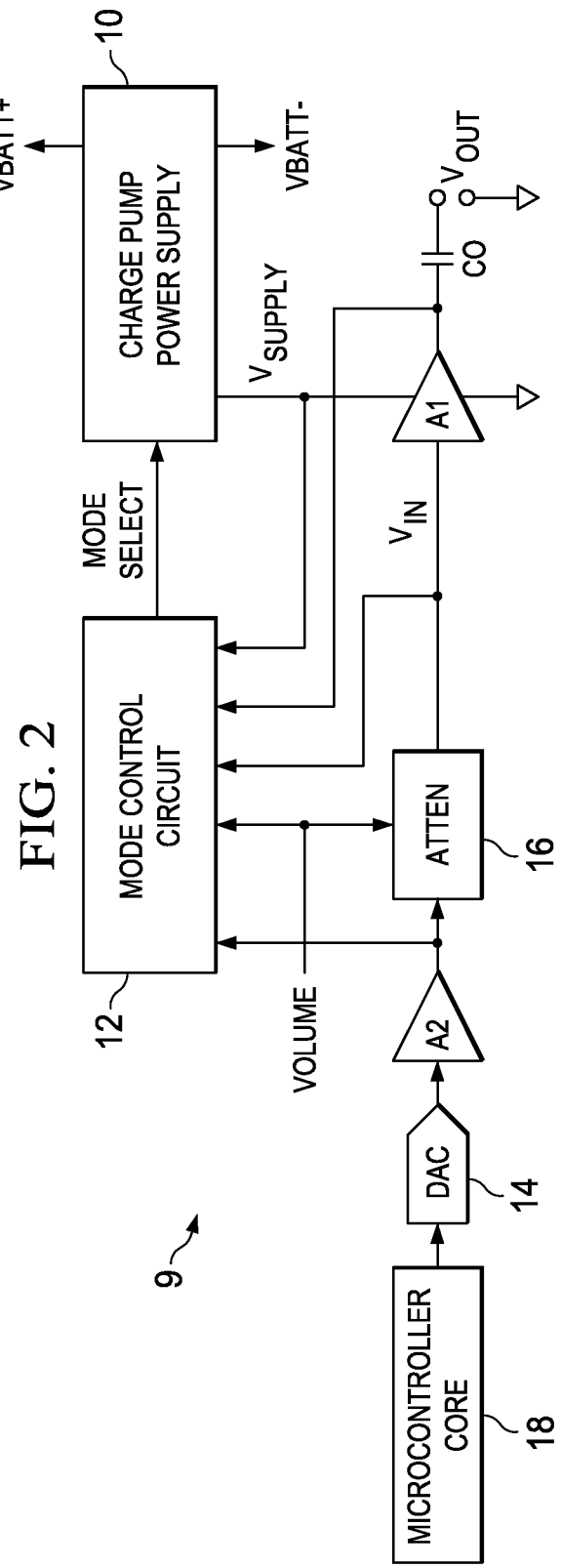
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal to a digital-to-analog converter (DAC) 14, which may in turn supply an analog audio input signal to a first amplifier stage A2 that may be operated from a fixed voltage power supply. In the embodiments represented by FIG. 2, the input to DAC 14 is a digital audio source, but that is not a limitation of the present disclosure, as the techniques of the present disclosure may be applied to an audio amplifier having a purely analog signal path. The signal at the output of first amplifier stage A2 may be provided to an attenuator 16 that receives a volume control signal and attenuates the signal accordingly. Attenuator 16 may be a digital potentiometer having control provided from a microcontroller or other digital control circuit responsive to a user interface, volume knob encoder or program command, or attenuator 16 may be an analog potentiometer that provides the volume control signal as an output indication from a secondary deck (separate potentiometer circuit coupled to the common shaft or other mechanism) for use in the power supply control algorithms described in the '496 application, which is incorporated by reference herein. While an attenuator 16 is shown as the volume control mechanism, it is understood that an equivalent volume control may be provided by a programmable resistor or adjustable gain in the feedback of amplifier A2 or another amplifier stage in the signal path. A final power amplifier stage A1 may amplify the audio input signal $V_{IN}$ received from attenuator 16 and provide an audio output signal $V_{OUT}$, which may operate a speaker, headphone transducer, and/or a line level signal output. A capacitor CO may be utilized to couple the output signal to the transducer or line level output, particularly if amplifier A1 is operated from a unipolar power supply having a quiescent voltage substantially differing from ground.

A charge pump power supply 10 may provide the power supply rail inputs of amplifier A1 and may receive a power supply input, generally from a battery or other power supply, depicted as battery terminal connections VBATT+ and VBATT−. A mode control circuit 12 may supply a Mode Select signal to charge pump power supply 10 that selects an operating mode of charge pump power supply 10 as described in greater detail in the '496 application. Also, charge pump power supply 10 output voltage $V_{SUPPLY}$ may be adjusted according to expected and/or actual audio signal levels at the amplifier output according to the techniques disclosed elsewhere in this disclosure and/or in the '496 application.

When low signal levels exist and/or are expected at amplifier output $V_{OUT}$, the power efficiency of the audio output stage may be improved by varying the differential supply voltage $V_{SUPPLY}$ in conformity with the output signal $V_{OUT}$ or a signal (e.g., volume control signal Volume, audio input signal $V_{IN}$) indicative of the output signal $V_{OUT}$. In order to determine the actual and/or expected signal amplitudes at the output of amplifier A1, the volume control signal Volume, audio output signal $V_{OUT}$, and/or audio input signal $V_{IN}$ may be supplied to mode control circuit 12 for controlling the differential power supply $V_{SUPPLY}$ generated by charge pump power supply 10, in conformity with the expected amplitude of the output signal.

Figure 3A:
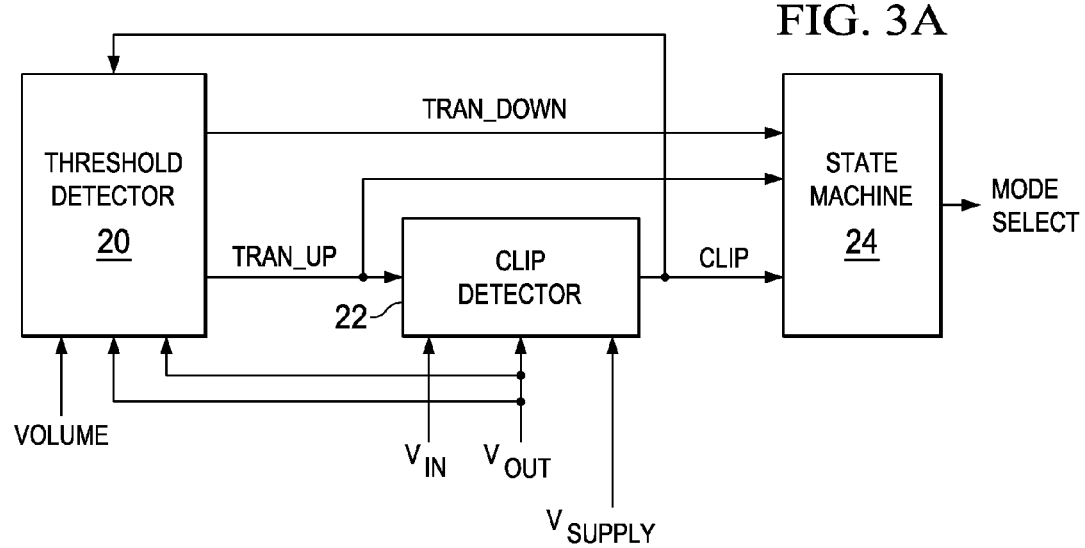
FIG. 3A is a block diagram of selected components of an example mode control circuit of an audio integrated circuit, in accordance with embodiments of the present disclosure.

FIG. 3A is a block diagram of selected components of an example mode control circuit 12 of an audio integrated circuit (e.g., audio IC 9), in accordance with embodiments of the present disclosure. As shown in FIG. 3A, mode control circuit 12 may comprise a threshold detector circuit 20, a clip detection circuit 22, and a state machine 24. Threshold detector circuit 20 may receive one or more of the volume control signal Volume, audio output signal $V_{OUT}$, and/or audio input signal $V_{IN}$, which may indicate the actual and/or expected signal amplitude at the output of amplifier A1, and based on such one or more signals, determine whether the amplitude of the output signal $V_{OUT}$ at the output of amplifier A1 crosses or is expected to cross a threshold for transitioning charge pump power supply 10 from its present mode of operation to another mode of operation. For example, the amplitude of the output signal $V_{OUT}$ may increase above a threshold for transitioning charge pump power supply 10 into another mode of operation in which it increases the supply voltage $V_{SUPPLY}$, in which case threshold detector circuit 20 may assert the signal TRAN_UP. As another example, the amplitude of the output signal $V_{OUT}$ may decrease below a threshold for transitioning charge pump power supply 10 into another mode of operation in which it decreases the supply voltage $V_{SUPPLY}$, in which case threshold detector circuit 20 may assert the signal TRAN_DOWN.

Clip detector circuit 22 may receive the TRAN_UP signal, power supply voltage $V_{SUPPLY}$, and one or more of audio output signal $V_{OUT}$ and/or audio input signal $V_{IN}$. Based on such received signals, clip detector circuit 22 may determine whether a difference between power supply voltage $V_{SUPPLY}$ and audio output signal $V_{OUT}$ is within a predetermined threshold voltage and generate an output signal CLIP in response to the determination. The predetermined threshold voltage may represent a minimum voltage headroom between power supply voltage $V_{SUPPLY}$ and audio output signal $V_{OUT}$ and/or indicate whether audio output signal $V_{OUT}$ is in danger of being clipped by power supply voltage $V_{SUPPLY}$. In some embodiments, the signal TRAN_UP may serve as an enable signal for clip detector circuit 22, such that clip detector 22 operates and generates an output signal only when TRAN_UP is asserted. An example clip detector circuit 22 is shown in FIG. 4, which is discussed in greater detail below.

State machine 24 may receive the TRAN_UP, TRAN_DOWN, and CLIP signals, and based thereon, generate the Mode Select signal for communication to charge pump power supply 10. For example, in some embodiments of the present disclosure, state machine 24 may generate a Mode Select signal for transitioning charge pump power supply 10 to a higher supply voltage $V_{SUPPLY}$ when signal TRAN_UP is asserted and signal CLIP indicates audio output signal $V_{OUT}$ is clipped at power supply voltage $V_{SUPPLY}$. In such embodiments, state machine 24 may also generate a Mode Select signal for transitioning charge pump power supply 10 to a lower supply voltage $V_{SUPPLY}$ when signal TRAN_DOWN is asserted. In some of such embodiments, state machine 24 may generate a Mode Select signal for transitioning charge pump power supply 10 to a lower supply voltage $V_{SUPPLY}$ only when signal TRAN_DOWN is asserted for a particular duration of time. In these and other embodiments, responsive to signal TRAN_UP being asserted as a result of the audio output signal $V_{OUT}$ exceeding a particular threshold and signal CLIP that the difference between power supply voltage $V_{SUPPLY}$ and audio output signal $V_{OUT}$ is less than the predetermined threshold voltage, threshold detector circuit 20 may change the particular threshold to a level of the amplitude of the output signal, such that TRAN_UP may thereafter be asserted only when the audio output signal $V_{OUT}$ exceeds this new threshold.

Figure 3B:
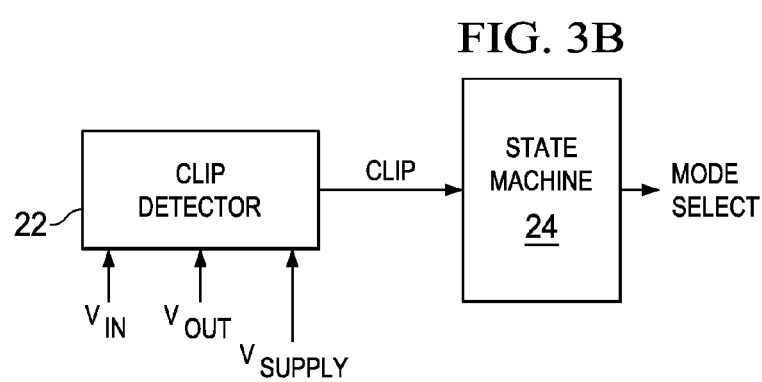
FIG. 3B is a block diagram of selected components of another example mode control circuit of an audio integrated circuit, in accordance with embodiments of the present disclosure.

FIG. 3B is a block diagram of selected components of another example mode control circuit 12 of an audio integrated circuit (e.g. audio IC 9), in accordance with embodiments of the present disclosure. Mode control circuit 12 depicted in FIG. 3B may be similar in structure and functionality to mode control circuit 12 depicted in FIG. 3A, except that mode control circuit 12 depicted in FIG. 3B does not include threshold detector 20 but includes a clip detector circuit 22 with functionality to the clip detector circuit described with respect to FIG. 3A, above. In the embodiments represented by FIG. 3B, state machine 24 may generate a Mode Select signal for transitioning charge pump power supply 10 to a higher supply voltage $V_{SUPPLY}$ when signal CLIP indicates that the difference between power supply voltage $V_{SUPPLY}$ and audio output signal $V_{OUT}$ is less than the predetermined threshold voltage. In such embodiments, state machine 24 may also generate a Mode Select signal for transitioning charge pump power supply 10 to a lower supply voltage $V_{SUPPLY}$ when signal CLIP indicates that the difference between power supply voltage $V_{SUPPLY}$ and audio output signal $V_{OUT}$ is more than the predetermined threshold voltage. In some of such embodiments, state machine 24 may generate a Mode Select signal for transitioning charge pump power supply 10 to a lower supply voltage $V_{SUPPLY}$ only when signal CLIP indicates that the difference between power supply voltage $V_{SUPPLY}$ and audio output signal $V_{OUT}$ is less than the predetermined threshold voltage for a particular duration of time.

Figure 4:
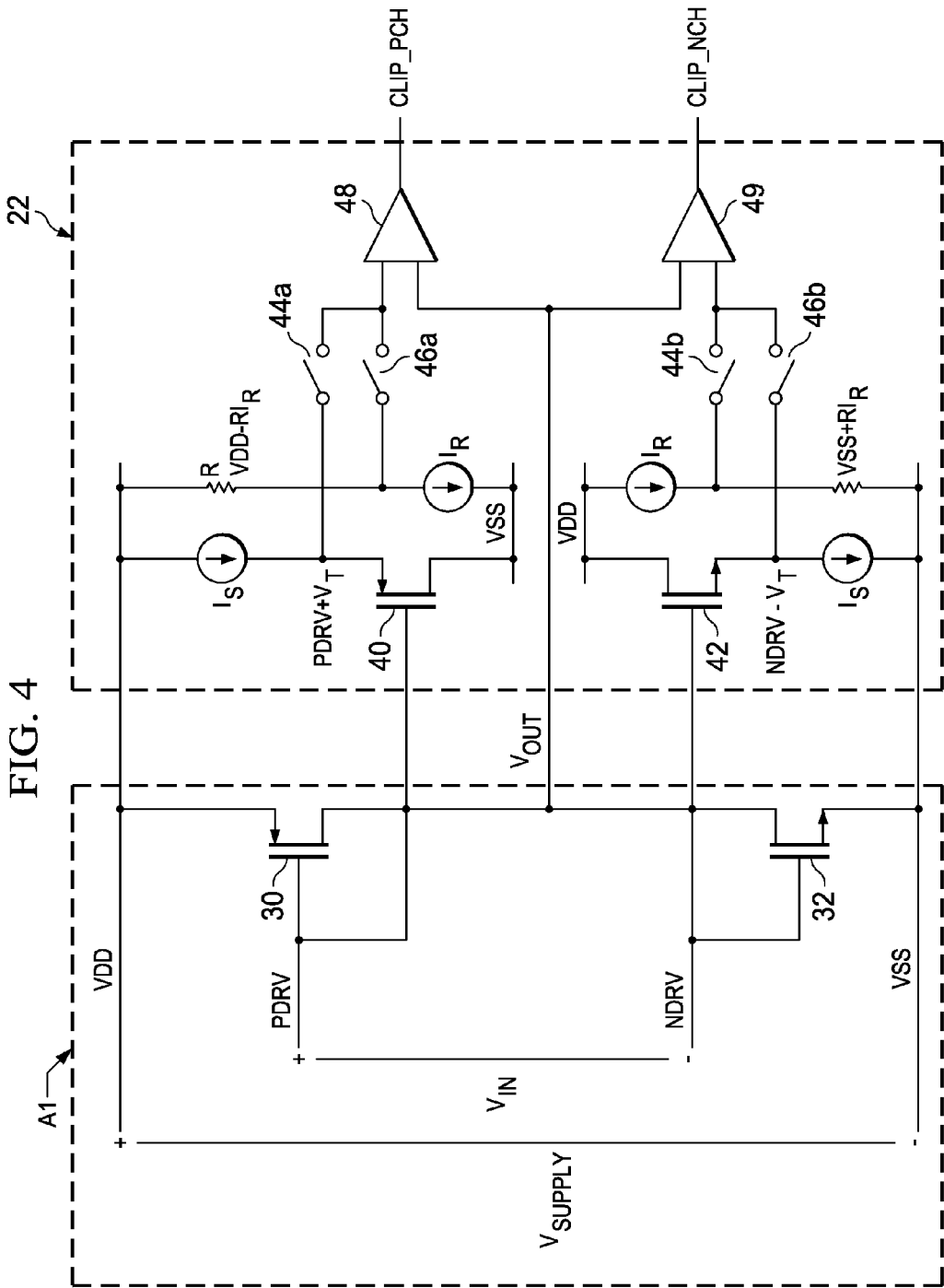
FIG. 4 is a circuit diagram of selected components of an example clip detection circuit of a mode control circuit, in accordance with embodiments of the present disclosure.

FIG. 4 is a circuit diagram of selected components of an example clip detection circuit 22 of a mode control circuit 12 along with power amplifier A1, in accordance with embodiments of the present disclosure. As shown in FIG. 4, power amplifier A1 may receive differential analog audio input signal $V_{IN}$, which may include a positive polarity predriver signal PDRV received by a driver device 30 (e.g., a p-type metal-oxide-semiconductor field-effect transistor) and a negative polarity predriver signal NDRV received by a driver device 32 (e.g., an n-type metal-oxide-semiconductor field-effect transistor), wherein each driver device 30, 32 is capable of driving the output signal $V_{OUT}$ as a function of the individual predriver signals PDRV and NDRV. In addition, power amplifier A1 may receive power supply voltage $V_{SUPPLY}$ from charge pump power supply 10 in the form of a bi-polar power supply voltage across a pair of power supply rail connections VDD and VSS of power amplifier A1.

Clip detection circuit 22 may comprise one or more comparison subcircuits. Each subcircuit may compare a first signal indicative of a predriver signal (e.g., PDRV or NDRV) to audio output signal $V_{OUT}$ and/or compare a second signal indicative of a power supply voltage (e.g., VDD or VSS) to audio output signal $V_{OUT}$. For example, clip detection circuit 22 may include a subcircuit having a p-type metal-oxide-semiconductor field-effect transistor 40 coupled at its gate to the predriver signal PDRV, at a first non-gate terminal to supply voltage VSS, and at a second non-gate terminal to a current source having a current $I_S$, such that a voltage equal to the predriver signal PDRV plus a threshold voltage $V_{TP}$ (and thus indicative of the predriver signal PDRV) forms at the second non-gate terminal. The subcircuit may also include a resistor with resistance R coupled at a first terminal to supply voltage VDD, and coupled at a second terminal to a current source having a current $I_R$, such that a voltage equal to the supply voltage VDD minus the product $R \times I_R$ (and thus indicative of the supply voltage VDD) forms at the second terminal. In some embodiments, values of R and $I_R$ may be selected such that the voltage forming at the second terminal of the resistor is approximately equal to the supply voltage VDD (e.g., the product $R \times I_R$ may equal approximately 50 millivolts or less in some embodiments). When switch 44a is closed, a comparator 48 may compare the first voltage signal PDRV+$V_{TP}$ to the audio output signal $V_{OUT}$. For example, a voltage PDRV+$V_{TP}$ lesser than $V_{OUT}$ may indicate the presence of clipping of audio output signal $V_{OUT}$, and in such case, signal CLIP_PCH may be asserted. When switch 46a is closed, comparator 48 may compare the second voltage signal VDD−$RI_R$ to the audio output signal $V_{OUT}$. As an example, a voltage VDD−$RI_R$ lesser than $V_{OUT}$ may indicate the presence of clipping of audio output signal $V_{OUT}$, and in such case, signal CLIP_PCH may be asserted.

Additionally or alternatively, clip detection circuit 22 may include a subcircuit having an n-type metal-oxide-semiconductor field-effect transistor 42 coupled at its gate to the predriver signal NDRV, at a first non-gate terminal to supply voltage VDD, and at a second non-gate terminal to a current source having a current $I_S$, such that a voltage equal to the predriver signal NDRV minus a threshold voltage $V_{TN}$ (and thus indicative of the predriver signal NDRV) forms at the second non-gate terminal. The subcircuit may also include a resistor with resistance R coupled at a first terminal to supply voltage VSS, and coupled at a second terminal to a current source having a current $I_R$, such that a voltage equal to the supply voltage VSS plus the product $R \times I_R$ (and thus indicative of the supply voltage VSS) forms at the second terminal. In some embodiments, values of R and $I_R$ may be selected such that the voltage forming at the second terminal of the resistor is approximately equal to the supply voltage VSS (e.g., the product $R \times I_R$ may equal approximately 50 millivolts or less in some embodiments). When switch 44b is closed, a comparator 49 may compare the first voltage signal NDRV–$V_{IN}$ to the audio output signal $V_{OUT}$. For example, a voltage NDRV+$V_{IN}$ greater than $V_{OUT}$ may indicate the presence of clipping of audio output signal $V_{OUT}$, and in such case, signal CLIP_NCH may be asserted. When switch 46b is closed, comparator 49 may compare the second voltage signal VSS+$RI_R$ to the audio output signal $V_{OUT}$. As an example, a voltage VSS+$RI_R$ greater than $V_{OUT}$ may indicate the presence of clipping of audio output signal $V_{OUT}$, and in such case, signal CLIP_NCH may be asserted.

Thus, in accordance with the foregoing, clip detector circuit 22 may generate a signal CLIP, which may be a logical OR of signals CLIP_PCH and CLIP_NCH.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An audio amplifier circuit for providing an output signal to an audio transducer, the audio amplifier circuit comprising:
    a power amplifier having an audio input for receiving an audio input signal, an audio output for providing the output signal, and a power supply input, wherein the power amplifier may generate the output signal based on the audio input signal;
    a charge pump power supply configured to provide a power supply voltage to the power supply input, wherein the charge pump power supply has a select input for selecting a selected operating mode of the charge pump power supply from a plurality of operating modes comprising a first operating mode and a second operating mode, such that in the first operating mode, the power supply voltage is equal to a first voltage, and such that in the second operating mode the power supply voltage is equal to a fraction of the first voltage; and
    a control circuit for generating the select input based on a magnitude of the power supply voltage and a magnitude of the output signal, such that the charge pump power supply operates in an operating mode of the plurality of operating modes having the lowest power supply voltage in which a difference between a magnitude of the power supply voltage and a magnitude of the output signal is more than the predetermined threshold voltage.

2. The audio amplifier circuit of claim 1, wherein the control circuit is further configured to:
    generate the select input for selecting the first operating mode if the difference between the magnitude of the power supply voltage and the magnitude of the output signal is less than a predetermined threshold voltage; and
    generate the select input for selecting the second operating mode if the difference between the magnitude of the power supply voltage and the magnitude of the output signal is more than the predetermined threshold voltage.

3. The audio amplifier circuit of claim 2, wherein the control circuit is further configured to, following generation of the select input for selecting the first operating mode and responsive to the difference between the magnitude of the power supply voltage and the magnitude of the output increasing to more than the predetermined threshold voltage, generate the select input for selecting the second operating mode.

4. The audio amplifier circuit of claim 1, wherein the control circuit further generates the select input based on a comparison of a signal indicative of the output signal and a threshold signal level.

5. The audio amplifier circuit of claim 4, wherein control circuit is further configured to, responsive to an increase of a magnitude of the output signal from below the threshold signal level to above the threshold signal level:
    generate the select input for selecting the first operating mode if a difference between the magnitude of the power supply voltage and the magnitude of the output signal is less than a predetermined threshold voltage; and
    generate the select input for selecting the second operating mode if a difference between the magnitude of the power supply voltage and the magnitude of the output signal is more than the predetermined threshold voltage.

6. The audio amplifier circuit of claim 5, wherein the control circuit is further configured to, following generation of the select input for selecting the first operating mode and responsive to a decrease of the magnitude of the output signal from above the threshold signal level to below the threshold signal level, generate the select input for selecting the second operating mode.

7. The audio amplifier circuit of claim 5, wherein the control circuit is further configured to, following generation of the select input for selecting the first operating mode and responsive to a decrease of the magnitude of the output signal from above the threshold signal level to below the threshold signal level, generate the select input for selecting the second operating mode if the output signal remains below the threshold signal level for at least a predetermined duration of time.

8. The audio amplifier circuit of claim 5, wherein the control circuit is further configured to, responsive to an increase of the magnitude of the output signal from below the threshold signal level to above the threshold signal level, increase the threshold signal level to an increased threshold signal level if the difference between the magnitude of the power supply voltage and the magnitude of the output signal is less than a predetermined threshold voltage.

9. The audio amplifier circuit of claim 8, wherein the control circuit is further configured to, following generation of the select input for selecting the first operating mode and responsive to a decrease of the magnitude of the output signal from above the increased threshold signal level to below the increased threshold signal level, generate the select input for selecting the second operating mode if the output signal remains below the threshold signal level for at least a predetermined duration of time.

10. The audio amplifier circuit of claim 8, wherein the control circuit is further configured to, following generation of the select input for selecting the first operating mode and responsive to a decrease of the magnitude of the output signal from above the increased threshold signal level to below the increased threshold signal level, generate the select input for selecting the second operating mode.

11. The audio amplifier of claim 10, wherein the control circuit is further configured to, following an increase of the threshold signal level to the increased threshold signal level and generation of the select input for selecting the second operating mode and responsive to an increase of the magnitude of the output signal from below the increased threshold signal level to above the increased threshold signal level:
  generate the select input for selecting the first operating mode if the difference between the magnitude of the power supply voltage and the magnitude of the output signal is less than the predetermined threshold voltage; and
  generate the select input for selecting the second operating mode if the difference between the magnitude of the power supply voltage and the magnitude of the output signal is more than the predetermined threshold voltage.

12. The audio amplifier circuit of claim 1, wherein the control circuit is further configured to adapt the predetermined threshold voltage based on magnitude of the output signal.

13. A method for providing an output signal to an audio transducer, comprising:
  providing a power supply voltage to a power supply input of a power amplifier by a charge pump power supply having a select input for selecting a selected operating mode of the charge pump power supply from a plurality of operating modes comprising a first operating mode and a second operating mode, such that in the first operating mode, the power supply voltage is equal to a first voltage, and such that in the second operating mode the power supply voltage is equal to a fraction of the first voltage; wherein the power amplifier has an audio input for receiving an audio input signal, and an audio output for providing the output signal, and generates the output signal based on the audio input signal; and
  selecting the selected operating mode of the charge pump power supply based on a magnitude of the power supply voltage and a magnitude of the output signal, such that the charge pump power supply operates in an operating mode of the plurality of operating modes having the lowest power supply voltage in which a difference between a magnitude of the power supply voltage and a magnitude of the output signal is more than the predetermined threshold voltage.

14. The method of claim 13, further comprising:
  selecting the first operating mode if the difference between the magnitude of the power supply voltage and the magnitude of the output signal is less than a predetermined threshold voltage; and
  selecting the second operating mode if the difference between the magnitude of the power supply voltage and the magnitude of the output signal is more than the predetermined threshold voltage.

15. The method of claim 14, further comprising, following generation of the select input for selecting the first operating mode and responsive to the difference between the magnitude of the power supply voltage and the magnitude of the output increasing to more than the predetermined threshold voltage, selecting the second operating mode.

16. The method of claim 13, further comprising selecting the operating mode based on a comparison of a signal indicative of the output signal and a threshold signal level.

17. The method of claim 16, further comprising, responsive to an increase of the magnitude of the output signal from below the threshold signal level to above the threshold signal level:
  selecting the first operating mode if a difference between the magnitude of the power supply voltage and the magnitude of the output signal is less than a predetermined threshold voltage; and
  selecting the second operating mode if a difference between the magnitude of the power supply voltage and the magnitude of the output signal is more than the predetermined threshold voltage.

18. The method of claim 17, further comprising, following generation of the select input for selecting the first operating mode and responsive to a decrease of the magnitude of the output signal from above the threshold signal level to below the threshold signal level, selecting the second operating mode.

19. The method of claim 17, further comprising, following generation of the select input for selecting the first operating mode and responsive to a decrease of the magnitude of the output signal from above the threshold signal level to below the threshold signal level, selecting the second operating mode if the output signal remains below the threshold signal level for at least a predetermined duration of time.

20. The method of claim 17, further comprising, responsive to an increase of the magnitude of the output signal from below the threshold signal level to above the threshold signal level, increasing the threshold signal level to an increased threshold signal level if the difference between the magnitude of the power supply voltage and the magnitude of the output signal is less than the predetermined threshold voltage.

21. The method of claim 20, further comprising, following generation of the select input for selecting the first operating mode and responsive to a decrease of the magnitude of the output signal from above the increased threshold signal level to below the increased threshold signal level, selecting the second operating mode if the output signal remains below the threshold signal level for at least a predetermined duration of time.

22. The method of claim 20, further comprising, following generation of the select input for selecting the first operating mode and responsive to a decrease of the magnitude of the output signal from above the increased threshold signal level to below the increased threshold signal level, selecting the second operating mode.

23. The method of claim 22, further comprising, following an increase of the threshold signal level to the increased threshold signal level and generation of the select input for selecting the second operating mode and responsive to an increase of the magnitude of the output signal from below the increased threshold signal level to above the increased threshold signal level:

selecting the first operating mode if the difference between the magnitude of the power supply voltage and the magnitude of the output signal is less than the predetermined threshold voltage; and selecting the second operating mode if the difference between the magnitude of the power supply voltage and the magnitude of the output signal is more than the predetermined threshold voltage.

24. The method of claim 13, further comprising adapting the predetermined threshold voltage based on magnitude of the output signal.

* * * * *